(12) United States Patent
Oosawa et al.

(10) Patent No.: US 7,242,916 B2
(45) Date of Patent: *Jul. 10, 2007

(54) COMMUNICATION SEMICONDUCTOR INTEGRATED CIRCUIT DEVICE AND WIRELESS COMMUNICATION SYSTEM

(75) Inventors: Hirotaka Oosawa, Isesaki (JP);
Masumi Kasahara, Takasaki (JP);
Noriyuki Kurakami, Maebashi (JP);
Toshiya Uozumi, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/519,061
(22) Filed: Sep. 12, 2006

(65) Prior Publication Data
US 2007/0010225 A1    Jan. 11, 2007

Related U.S. Application Data

(63) Continuation of application No. 10/414,149, filed on Apr. 16, 2003, now Pat. No. 7,146,143.

(30) Foreign Application Priority Data
Apr. 26, 2002 (JP) .............................. 2002-125631

(51) Int. Cl.
*H04B 1/06* (2006.01)
*H04B 7/00* (2006.01)

(52) U.S. Cl. ............. 455/245.1; 455/84; 455/260; 455/126; 455/180.3; 455/190.3; 455/264; 331/25; 331/16; 375/327; 375/344

(58) Field of Classification Search ............. 455/245.1, 455/260, 126, 84, 180.3, 190.3, 264; 375/344; 377/47

See application file for complete search history.

(56) References Cited

U.S. PATENT DOCUMENTS 5,203,023 A * 4/1993 Saito et al. ................. 455/133

| 5,608,354 | A | | 3/1997 | Hori |
| 5,727,019 | A | | 3/1998 | Tatsumi |
| 5,734,970 | A | | 3/1998 | Saito |
| 5,819,161 | A | | 10/1998 | Saito |
| 5,835,530 | A | * | 11/1998 | Hawkes ..................... 375/225 |
| 6,188,258 | B1 | | 2/2001 | Nakatani |
| 6,195,400 | B1 | | 2/2001 | Maeda |
| 6,678,512 | B1 | * | 1/2004 | Kaminski et al. ........... 455/334 |
| 6,738,646 | B2 | * | 5/2004 | Miyoshi et al. ............ 455/561 |
| 7,072,392 | B2 | * | 7/2006 | Xia et al. ................... 375/233 |

FOREIGN PATENT DOCUMENTS

WO    PCT/GB02/05152    4/2002

* cited by examiner

*Primary Examiner*—Marceau Milord
(74) *Attorney, Agent, or Firm*—Mattingly, Stanger, Malur & Brundidge, P.C.

(57) ABSTRACT

The invention provides a communication semiconductor integrated circuit device (RF IC) capable of pulling in the frequency of a PLL circuit to a desired set frequency at high speed even in the case where a frequency settable range of the PLL circuit is wide without providing a current source other than a current source for charging and discharging in an normal operation. An oscillator as a component of a PLL circuit is constructed so as to be operative in a plurality of bands. In a state where a control voltage of the oscillator is fixed to a predetermined value, an oscillation frequency of the oscillator is measured in each of bands and stored in a storing circuit. A set value for designating a band supplied at the time of PLL operation is compared with the stored measured frequency value. From a result of comparison, a band to be actually used in the oscillator is determined, and a frequency difference between the maximum frequency of the selected band and the set frequency is obtained. Further, a control voltage closest to the set frequency is determined on the basis of the frequency difference and the frequency variable range of the selected band and the control voltage is applied to the oscillator to start oscillating operation. After that, a PLL loop is closed and locked.

10 Claims, 6 Drawing Sheets

COMMUNICATION SEMICONDUCTOR INTEGRATED CIRCUIT DEVICE AND WIRELESS COMMUNICATION SYSTEM

This application is a continuation of U.S. patent application Ser. No. 10/414,149, filed Apr. 16, 2003 now U.S. Pat. No. 7,146,143, which is incorporated by reference herein in its entirety.

BACKGROUND OF THE INVENTION

The present invention relates to a technique effective to be applied to a PLL (Phase Locked Loop) circuit having a VCO (Voltage Controlled Oscillator) and capable of switching an oscillation frequency and further to a high-speed pull-in technique of a PLL circuit. More particularly, the invention relates to a technique effective to be applied to a PLL circuit for generating an oscillation signal of a predetermined frequency mixed with a reception signal or transmission signal in a radio communication device such as a portable telephone capable of transmitting/receiving signals in a plurality of bands, a semiconductor integrated circuit device for high frequencies having the same, and a radio communication system.

In a radio communication system such as a portable telephone, a PLL circuit is used as a local oscillator for generating an oscillation signal of a predetermined frequency mixed with a reception signal or transmission signal. Hitherto, there is a dual-band portable telephone capable of handling signals in two frequency bands of, for example, GSM (Global System for Mobile Communication) of a band from 880 to 915 MHz and a DCS (Digital Cellular System) of a band from 1710 to 1785 MHz. Some dual-band portable telephones can deal with two bands by a single PLL by switching the frequency of the PLL circuit.

In recent years, there is a demand for a triple-band portable telephone capable of handling signals of, in addition to the GSM and DCS, a PCS (Personal Communication System) of a band from 1850 to 1915 MHz. It is expected that a portable telephone capable of handling the larger number of bands will be requested in future.

For such a semiconductor integrated circuit device for high frequencies (hereinbelow, called RF IC) for modulating a transmission signal and demodulating a reception signal, which is used for a portable telephone adapted to a plurality of bands, a direct conversion method is effective from the viewpoint of reduction in the number of components. Although the direct conversion method is relatively easily adapted to a plurality of bands, the frequency range in which a VCO can oscillates is wide. If one VCO is used to cover the whole frequencies, the sensitivity of the control voltage of the VCO becomes high and it causes a problem such that the VCO becomes vulnerable to external noise and fluctuations in a power source voltage.

On the other hand, to reduce the number of components, it is effective to form a VCO, which is conventionally generally provided as a module separate from an RF IC, on the same semiconductor chip on which the RF IC is also mounted. However, in the case of forming a on-chip VCO, variations in the absolute value of an oscillation frequency increase for the reason of manufacture, so that the function of adjusting the oscillation frequency after manufacture becomes indispensable. In the case of adjusting the variations by trimming of general mask option or bonding wire option used for a conventional semiconductor integrated circuit, increase in cost cannot be avoided.

SUMMARY OF THE INVENTION

The inventors et al. have developed and filed a communication semiconductor integrated circuit device (RF IC) having a PLL circuit (Japanese Unexamined Patent Publication No. 2002-11050: corresponding to PCT application No. GB2002/005152) in which sensitivity of a control voltage of a VCO does not become high even if the frequency range in which the VCO can oscillate is widened in order to be adapted to a plurality of bands and which is not easily influenced by external noise and fluctuations in a power source voltage and can automatically correct variations in oscillation frequency of the VCO by an internal circuit by the following configuration. An oscillation circuit as a component of the PLL circuit is constructed so as to be operative in a plurality of bands. In a state where a control voltage of the oscillation circuit is fixed to a predetermined value, an oscillation frequency of the oscillation circuit is measured in each of bands and stored in a storing circuit. A set value for designating a band supplied in an operation of the PLL circuit is compared with the stored measured frequency value. From a result of comparison, a band to be actually used in the oscillation circuit is determined.

In a portable telephone, a frequency used is determined at the start of transmitting/receiving operation, a VCO is started, and pull-in control is performed so that a PLL circuit oscillates at the frequency. The pull-in is desired to be performed in short time. In the publication, the pull-in control of the PLL circuit is not disclosed.

As a high-speed pull-in technique of a PLL circuit, for example, a method of increasing current of a charge pump for charging a capacitor of a loop filter for generating a control voltage of a VCO at the start of pull-in is known. However, the pull-in method has problems such that a current source for increasing the current at the time of pull-in is necessary in addition to a current source for charging/discharging a charge pump in normal operation. When the frequency settable range of the PLL circuit is wide, troublesome time control is necessary to accurately pull the frequency of the PLL circuit into a desired set frequency.

An object of the invention is to provide a communication semiconductor integrated circuit device (RF IC) capable of pulling the frequency of a PLL circuit into a desired set frequency at high speed without providing a current source in addition to a current source for charging/discharging in normal operation also in the case where a frequency settable range of the PLL circuit is wide.

Another object of the invention is to provide a communication semiconductor integrated circuit device capable of pulling in the frequency of a PLL circuit into a desired set frequency accurately at high speed even in the case where a frequency settable range of the PLL circuit is wide.

Further another object of the invention is to provide a communication semiconductor integrated circuit device capable of performing communication with signals in a plurality of frequency bands and realizing the reduced number of components by forming a VCO on the same semiconductor chip.

The above and other objects and novel features will become apparent from the description of the specification and the accompanying drawings.

An outline of a representative invention in inventions disclosed in the application will be described as follows.

An oscillation circuit as a component of a PLL circuit is constructed so as to be operative in a plurality of bands. A circuit capable of switching a control voltage of the oscillation circuit to a predetermined direct-current voltage is provided. In a state where the control voltage of the oscillation circuit is fixed to a predetermined value, an oscillation frequency of the oscillation circuit is measured in each of bands and stored in a storing circuit. A set value for designating a band supplied in an operation of the PLL circuit is compared with the stored measured frequency value. From a result of comparison, a band to be actually used in the oscillation circuit is determined, and a frequency difference between the maximum frequency of the selected band and the set frequency is obtained. Further, a control voltage closest to the set frequency is determined on the basis of the frequency difference and the frequency variable range of the selected band and applied from the control voltage switching circuit to the oscillation circuit. After oscillating operation is started, a PLL loop is closed and locked.

According to the means, an initial voltage extremely close to the control voltage applied when the oscillation circuit oscillates at a desired frequency can be applied at the start of oscillation operation. Thus, a communication semiconductor integrated circuit device having a PLL circuit capable of accurately performing pull-in at high speed without requiring a current source for pull-in of a PLL is obtained.

DETAILED DESCRIPTION OF THE PREFERRED EMBODIMENTS

Embodiments of the invention will be described hereinbelow with reference to the drawings.

Figure 1:
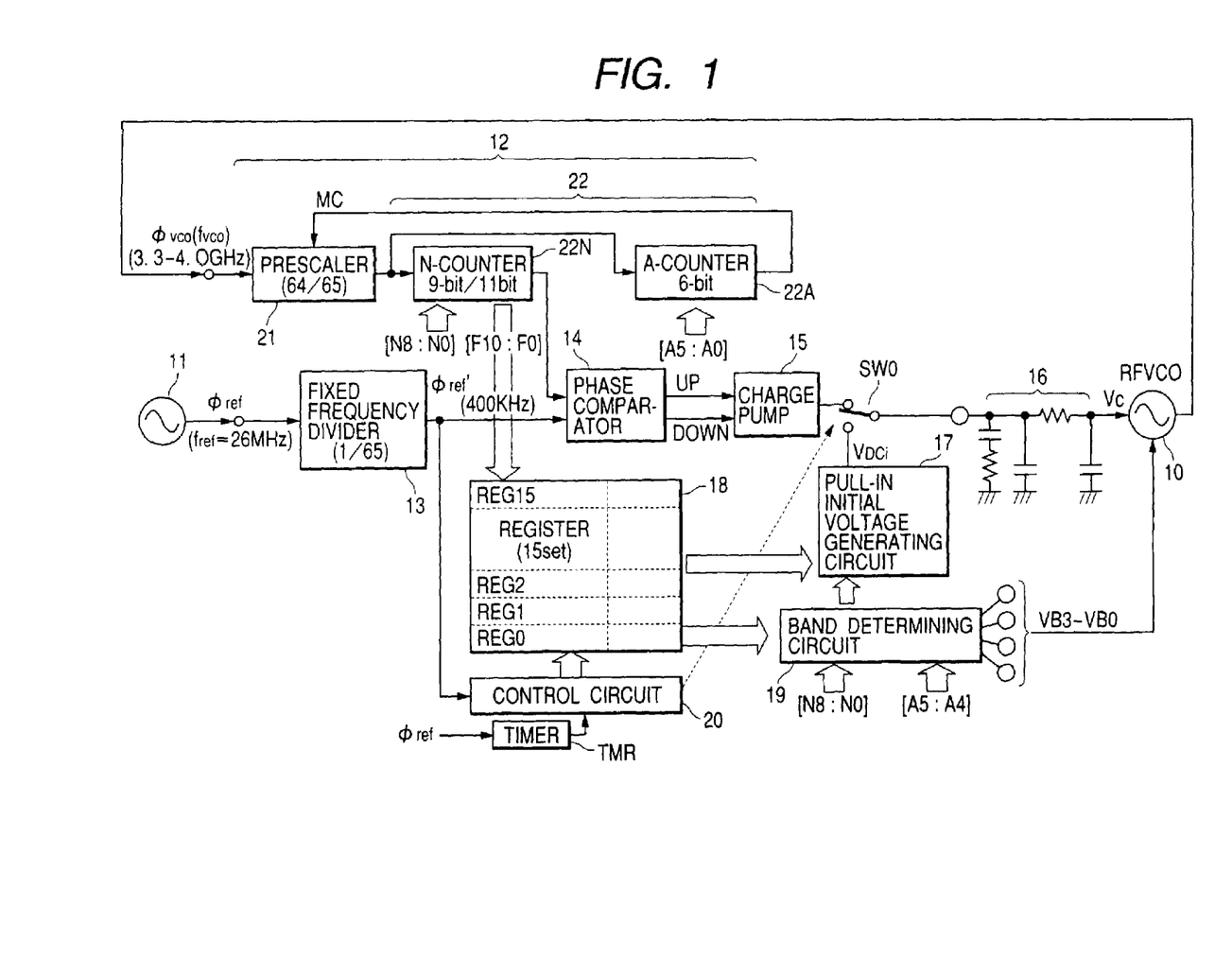
FIG. 1 is a block diagram showing an embodiment of a PLL circuit to which the invention is applied.

FIG. 1 shows an example of a high-speed pull-in PLL circuit to which the invention is applied. Shown in the diagram are a VCO (Voltage Controlled Oscillator) 10, a reference oscillation circuit (TCXO) 11 which uses a crystal oscillator and oscillates at precise high frequencies, a variable frequency divider 12 for dividing the frequency of an oscillation signal φvco of the VCO 10, a fixed frequency divider 13 for dividing the frequency of a reference oscillation signal φref of the reference oscillation circuit 11 to 1/65, a phase comparator 14 for comparing the phase of a signal subjected to frequency division of the variable frequency divider 12 with the phase of signal subjected to frequency division of the fixed frequency divider 13 and outputting a voltage UP or DOWN according to a phase difference, a charge pump 15, and a loop filter 16. A PLL loop in which the capacitive element of the loop filter 16 is charged up by the charge pump 15, and the resultant is output as a control voltage Vc of the VCO (Voltage Controlled Oscillator) 10 and the VCO 10 is oscillated at predetermined frequencies is constructed.

The PLL circuit of the embodiment includes, as shown in FIG. 1: a switch SW0 provided between the charge pump 15 and the loop filter 16, capable of supplying a predetermined direct-current voltage VDC in place of a voltage Vc from the charge pump 15 at the time of frequency measurement or PLL pull-in; a pull-in initial voltage generating circuit 17 for generating the direct-current voltage VDC to be applied to the charge pump 15; the variable frequency divider 12 for calculating an oscillation signal of the VCO 10 and dividing the frequency; a storing circuit 18 constructed by a register or the like for storing a value obtained by calculation of the variable frequency divider 12; a band determining circuit 19 for comparing a frequency value stored in the storing circuit 18 with set values N8 to N0 and A5 and A4 set from the outside into the variable frequency divider 12 and generating band switch signals VB3 to VB0 of the VCO 10; and a control circuit 20 for controlling the switch SW0, variable frequency divider 12, storing circuit 18, and band determining circuit 19.

At the time of measuring frequencies, the direct-current voltage VDC supplied to the loop filter 16 by the switch SW0 may have any voltage value as long as it is within a valid variable range of the control voltage Vc. In the embodiment, the upper limit value (Vcp-max) of the variable range of the control voltage Vc is selected. During measurement of frequencies, the direct-current voltage VDC is set to the same value while the band is switched.

The VCO 10 takes the form of, for example, a Colpitts' oscillation circuit using an LC resonance circuit. A plurality of capacitive elements constructing the LC resonance circuit are provided in parallel via switch elements. By selectively turning on the switch elements by the band switch signals VB3 to VB0, the values of the capacitive elements connected, that is, values of C of the LC resonance circuit are switched, so that the oscillation frequency can be switched step by step. On the other hand, the VCO 10 has a varicap diode as a variable capacitive element. The capacitance value of the varicap diode is changed by the control voltage Vc from the loop filter 16, and the oscillation frequency is continuously changed.

Figure 2A:
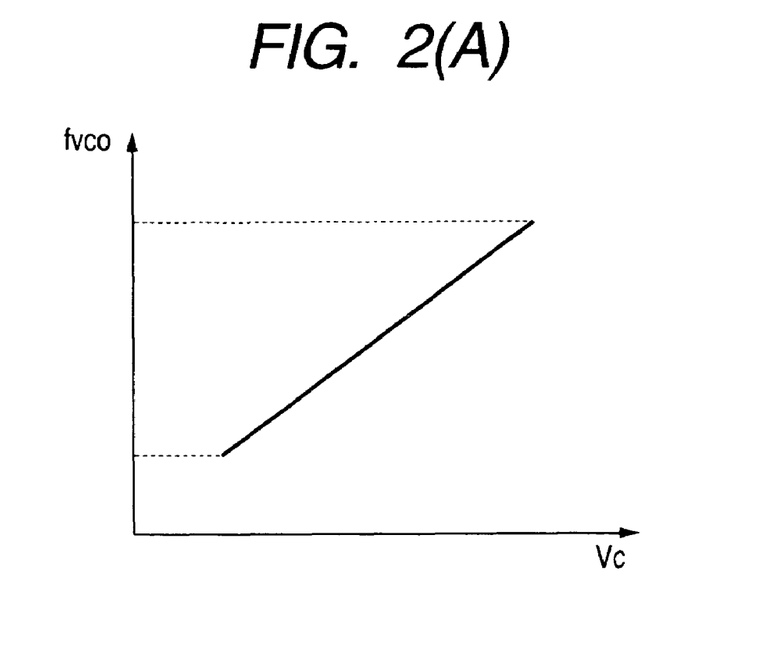
FIGS. 2A and 2B are graphs showing the relation between a control voltage Vc and an oscillation frequency fvco in the case where the frequency variable range of a VCO is continuously changed in the PLL circuit and the case where the frequency variable range is changed in each of bands.

In the case of widening the frequency range to be covered by the VCO, if it is realized only by changing the capacitance value of the varicap diode by the control voltage Vc, a Vc-fvso characteristic becomes sharp as shown in FIG. 2A, the sensitivity of the VCO, that is, the ratio ($\Delta f/\Delta Vc$) between a frequency change amount and a control voltage change amount increases and the VCO becomes vulnerable to noise. That is, only when small noise occurs in the control voltage Vc, the oscillation frequency fvco (φvco) of the VCO largely changes.

Figure 2B:
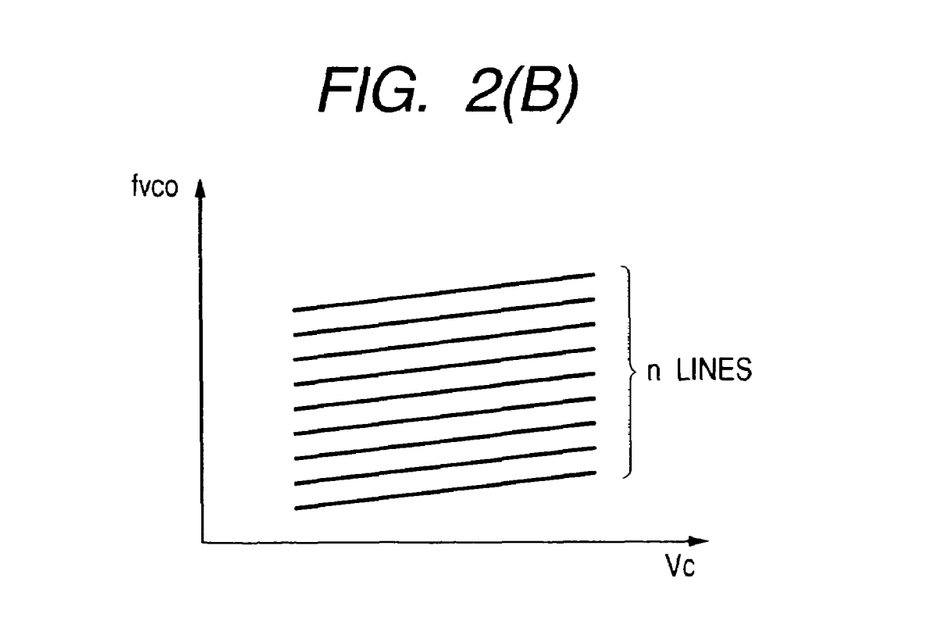

The VCO 10 of the embodiment is therefore constructed to perform oscillation control according to a plurality of Vc-fvco characteristic lines as shown in FIG. 2B by providing a plurality of capacitive elements constructing an LC resonance circuit in parallel and switching the capacitive elements used by the band switch signals VB3 to VB0 in n stages to change the value of C. Moreover, in this embodiment, by providing the storing circuit 18 and band determining circuit 19, the adjusting work of adjusting frequencies performed in the conventional PLL circuit becomes unnecessary.

Specifically, in the conventional PLL circuit, even in the case of constructing a VCO having a plurality of Vc-fvco characteristic lines as shown in FIG. 2B, the VCO is operated, frequencies are measured, and the frequencies are adjusted so that each of the plurality of Vc-fvco characteristic lines has a predetermined initial value and a predetermined gradient. In contrast, in the PLL circuit of the embodiment, the switch SW0 is preliminarily switched to apply the predetermined direct-current voltage VDC to the VCO 10, and the frequency is measured in each of the bands and stored in the storing circuit 18. In actual use, the set values N8 to N0 and A5 and A4 according to a designated band given from the outside to the variable frequency divider 12 are compared with measurement values stored in the storing circuit 18. Only one of the plurality (n) of Vc-fvco characteristic lines, which can cover the frequency range of the designated band as shown in FIG. 2B is selected, and the VCO is switched (capacitive element is switched) so as to perform an oscillation control operation according to the selected characteristic line.

According to such a method, by designing the VCO so as to cover a range which is a little wider than the frequency range desired to be covered by an amount corresponding to consideration of variations and so as to overlap the frequency ranges of which neighboring Vc-fvco characteristic lines in the n stages by a small amount (desirably, the half) as shown in FIG. 2B, a characteristic line which can cover the designated band always exists. Therefore, it is sufficient to select the frequency range corresponding to the designated band on the basis of the actual characteristic found by measurement. It becomes unnecessary to adjust the frequency, and it is unnecessary to preliminarily make the band to be used and the switch state of the VCO correspond to each other in a one-to-one manner.

The variable frequency divider 12 includes: a prescaler 21 for dividing the frequency of an oscillation signal of the VCO 10; and a modulo counter 22 constructed by a first counter 22N and a second counter 22A each for further dividing the frequency of the signal obtained by the frequency division of the prescaler 21.

The frequency dividing methods of the prescaler 21 and the modulo counter 22 are according to known-techniques. The prescaler 21 is constructed so that it can perform two kinds of frequency dividing operations of different frequency division ratios such as 1/64 and 1/65 which are switched by a count end signal of the second counter 22A. The first and second counters 22N and 22A are programmable counters. In the first counter 22N, an integral part obtained by dividing a desired frequency (oscillation frequency fvco of the VCO desired to be obtained as an output) by the frequency fref' of the reference oscillation signal φref' and by a first frequency ratio (64 in the embodiment) of the prescaler 21 is set. In the second counter 22A, the remainder (MOD) is set. After the set value is counted, the counting is finished, and the set value is counted again.

Concretely, for example, in the case where the frequency fref' of the reference oscillation signal φref' is 400 kHz and the oscillation frequency fvco of the desired VCO is 3789.6 MHz, 3789.6÷0.4÷64=148 and the remainder is 2. Consequently, the value N set in the first counter 22N is "148" and the value A set in the second counter 22A is "2". When the prescaler 21 and the modulo counter 22 operate in a state where such values are set, first, the prescaler 21 performs the 1/64 frequency dividing operation. When the second counter 22A counts the output of the prescaler 21 up to the set value of "2", a count end signal MC is output from the second counter 22A. By the signal MC, the operation of the prescaler 21 is switched, and the prescaler 21 performs the 1/65 frequency dividing operation until the second counter 22A counts up to the set value of "2" again.

By performing such operations, the modulo counter 22 can perform the frequency dividing operation not at a ratio of an integer but at a radio having a decimal part. In the PLL circuit of the embodiment, feedback is made so that the frequency of the output of the first counter 22N coincides with the frequency fref' (400 kHz) of the reference oscillation signal φref' and the VCO 10 is oscillation-controlled. Consequently, in the concrete example in which the value N set in the first counter 22N is "148" and the value A set in the second counter 22A is "2", the oscillation frequency fvco of the VCO 10 is obtained by the following equation and is 3789.6 MHz.

$$fvco=(64\times148+2)\times fref'=9474\times400=3789600$$

In practice, the first and second counters 22N and 22A take the form of binary counters, so that the value N set in the first counter 22N and the value A set in the second counter 22A are given by binary codes. In the embodiment, although not limited, the first counter 22N operates as a 9-bit counter and the second counter 22A operates as a 6-bit counter at the time of the PLL operation. Therefore, the value set in the first counter 22N is given by nine bit codes N8 to N0, and the value set in the second counter 22A is given by six bit codes A5 to A0.

Further, in the embodiment, the first counter 22N can operate as a 11-bit counter at the time of measuring the frequency. The VCO 10 is constructed so that the oscillation frequency can be switched in 16 bands, that is, 16 stages. In the storing circuit 18, 16 registers RE0 to REG15 for storing frequencies measured in the 16 bands are provided. The band determining circuit 19 has a comparator of 11 bits for comparing values stored in the registers REG0 to REG15 of the storing circuit 18 with the 9 bit codes of N8 to N0 set in the first counter 22N and the upper two bits A5 and A4 in the 6 bit codes of A5 to A0 set in the second counter 22A, and outputs a code of four bits VB3 to VB0 as a band switch signal to the VCO 10.

The control circuit 20 generates and outputs the switch signals VB3 to VB0 so as to sequentially select the 16 bands to the VCO 10 at the time of measuring frequencies. Further, at the time of measuring frequencies, the control circuit 20 operates the first counter 22N as a 11-bit counter and controls the first counter 22N so as to count clocks for a period of, not one cycle of the reference oscillation signal φref', but four cycles longer than that in the first embodiment. At the time of measuring frequencies, the control circuit 20 stops the operation of the second counter 22A and controls so as not to switch the frequency division ratio of the prescaler 22. By the operations, at the time of measuring frequencies, the prescaler 22 is controlled to perform the frequency dividing operation of only 1/64.

In the embodiment, the reason why the counting operation is performed for four cycles, not one cycle, of the reference oscillation signal φref' at the time of measuring frequencies is to increase measurement precision. Specifically, when it is assumed that the maximum error occurs in the counter 22N in measurement of one cycle of φref', that is, one pulse count error occurs in the counter 22N in measurement in one cycle of φref' for the reason that the prescaler 21 is provided, the error at that time is increased by 64 times as the frequency division ratio of the prescaler 21. Consequently, in the case where the reference oscillation signal φref is 400 kHz, the maximum error of the counter 22N is 25.6 MHz(=400 kHz×64). An error which occurs in the counter 22N in measurement of four cycles is reduced to ¼ which is about 6.4 MHz.

The count values of 11 bits counted by the first counter 22N at the time of frequency measurement are stored in any of the registers in the storing circuit 18. In the PLL operation, the upper eight bits of the stored value are regarded as an integral part and compared with the set codes N8 to N0 in the first counter 22N supplied from the outside in the band determining circuit 19. The lower two bits out of the values stored in the registers of the storing circuit 18 are regarded as a decimal part, and compared with the upper two bits A5 and A4 out of the set codes A5 to A0 in the second counter 22A supplied from the outside in the band determining circuit 19. From a result of comparison between the stored values in the registers REG0 to REG15 of the storing circuit 18 and the set codes N8 to N0 and A5 and A4, the use band of the VCO 10 is determined. Band switch codes VB3 to VB0 for selecting the band are generated and supplied to the VCO 10. In the VCO 10, in the case of the PLL circuit used in a communication system such as a GSM, the bands are set at intervals such as 400 kHz in accordance with channel intervals of the GSM.

Figure 3:
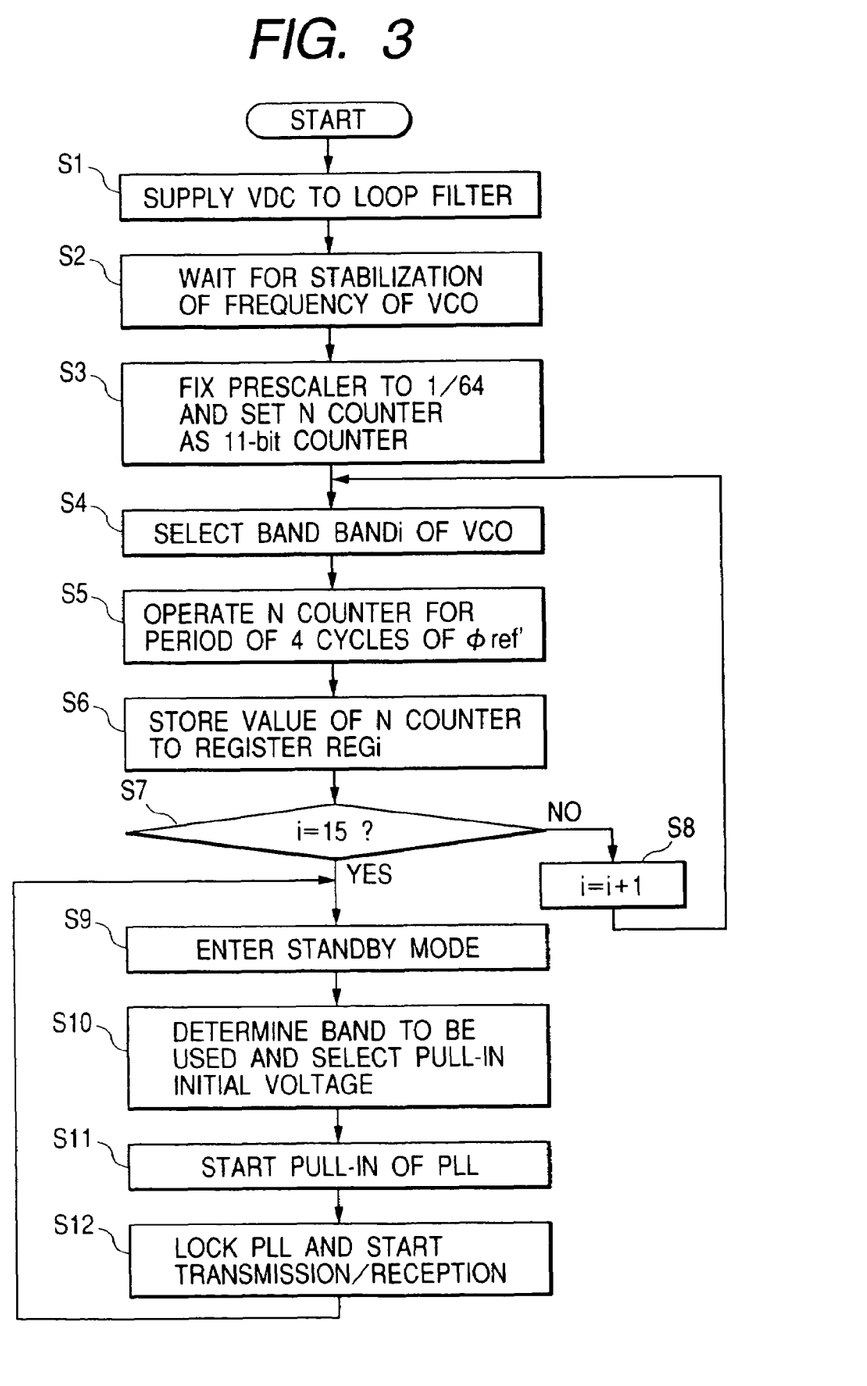
FIG. 3 is a flowchart showing an example of a frequency measuring procedure of the VCO in the PLL circuit of the embodiment and a pull-in operating procedure of the PLL circuit.

The procedure of the frequency measuring operation by the control circuit 20 in the PLL circuit in the embodiment and the pull-in operation of the PLL will be described by using the flowchart of FIG. 3. The frequency measurement is performed, for example, each time the system is turned on.

When the frequency measurement of the RF VCO starts, the control circuit 20 first switches the switch SW0 to supply the direct-current voltage VDC to the loop filter 16 (step S1). The control circuit 20 waits until the voltage Vc of the loop filter 16 is stabilized and the oscillation frequency of the VCO 10 becomes stable (step S2). Subsequently, the control circuit 20 fixes the frequency dividing ratio of the prescaler 21 to 1/64 and sets so that the first counter 22N operates as a 11-bit counter (step S3). The control circuit 20 refers to a pointer indicative of a selected band and outputs the codes VB3 to VB0 for selecting the band of the VCO 10 (step S4). The band selected first is, for example, BAND0 of which frequency range is the lowest.

Next, the control circuit 20 allows the first counter 22N to perform the counting operation for four cycles of the reference oscillation signal φref (step S5). In step S6, the count value of the counter is stored into a register in the storing circuit 18. The register to which the count value is stored first is the first register REG0. After that, the control circuit 20 determines whether the frequency measurement with respect to all of the bands has been finished or not (step S7). If NO, the control circuit 20 adds one (+1) to the value of the pointer indicative of the selected band in step S8, returns to step S4, and repeats the operations from step S4 to step S8. After the frequency measurement is finished on all of bands, the control circuit 20 advances from step S7 to a standby mode in step S9, and finishes the frequency measurement.

After that, when a frequency set value according to the used channel is supplied from a baseband circuit in association with start of transmission/reception in the standby mode, a band used in the VCO 10 is determined from a result of comparison between the values stored in the registers RE0 to REG15 in the storing circuit 18 and the set codes N8 to N0, A5, and A4 on the basis of the frequency set value in the band determining circuit 19. A pull-in initial voltage is selected by the following procedure in the pull-in initial voltage generating circuit 17 (step S10).

Subsequently, the switch SW0 is switched by the control circuit 20, a voltage generated by the pull-in initial voltage generating circuit 17 is applied to the loop filter 16, and pull-in is started (step S11). At the time when it is expected that a loop is stabilized after lapse of predetermined time since the pull-in was started, the control circuit 20 switches the switch SW0 to connect the charge pump 15 and the loop filter 16, thereby locking the PLL loop. After that, transmission and reception is started (step S12). The control circuit 20 has a timer TMR for performing such time control. The timer TMR is constructed to perform a counting operation on the basis of, for example, the reference oscillation signal φref from the reference oscillation circuit 11.

The pull-in initial voltage generating circuit 17 will now be described.

It is assumed that a set value corresponding to a frequency f(s) is supplied from the baseband circuit and the i-th band is selected from "n" (for example, 16) bands according to the set value. When the maximum frequency is f(i:max) and the minimum frequency is f(i:min) in the control voltage variable range of the band "i", f(i:min)<f(s)<f(i:max). When the frequency band next lower than the selected band is i−1, the maximum frequency in the control voltage variable range of the band i−1 is f(i−1:max) and the minimum frequency is expressed as f(i−1:min), and f(i:min)=f(i−1:max).

Figure 4:
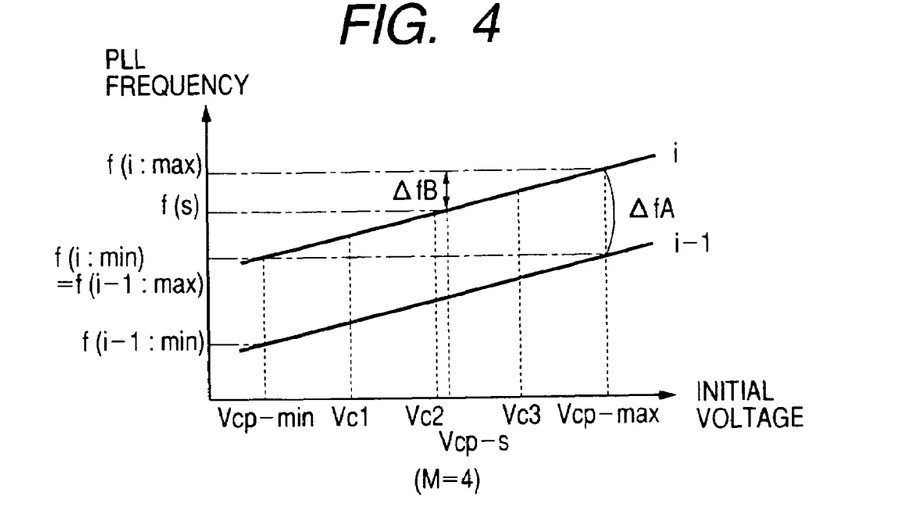
FIG. 4 is a diagram for explaining a method of determining a pull-in initial voltage of the PLL circuit of the embodiment.

On the other hand, by setting the voltage of the loop filter 16 when the PLL circuit is locked at the maximum frequency f(i:max) as Vcp-max and setting the voltage of the loop filter 16 when the PLL circuit is locked at the minimum frequency f(i:min) as Vcp-min, a voltage Vcp-s of the loop filter 16 when the PLL circuit is locked at the set frequency f(s) can be obtained as follows from FIG. 4. It is assumed that, at the time of the frequency measurement, measurement is executed at the maximum voltage Vcp-max of the control voltage variable range, and a result of the measurement is stored in the registers REG0 to REG15 of the storing circuit 18.

In this case, first, the maximum frequency f(i:max) of the band "i" selected according to the set frequency f(s) and the maximum frequency f(i−1:max) of the band i−1 next lower than the band "i" are read from the storing circuit 18 and the frequency difference ΔfA=f(i:max)−f(i−1:max) is calculated. The difference ΔfB(=f(i:max)−f(s)) between the maximum frequency f(i:max) of the selected band "i" and the set frequency f(s) is calculated. By using the frequency differences ΔfA and ΔfB, the voltage Vcp-s of the loop filter 16 when the PLL loop is locked at the set frequency f(s) can be expressed by the following equation.

$$Vcp\text{-}s = Vcp\text{-min} + (Vcp\text{-max} - Vcp\text{-min}) \times (1 - \Delta fB/\Delta fA)$$

Therefore, by applying the voltage Vcp-s as the initial voltage VDCi to the loop filter 16, the PLL can be pulled in at high speed. However, to realize a circuit of generating continuous voltages expressed by such an equation by a semiconductor integrated circuit device, a high-precision DA converter is required. In the embodiment, consequently, the pull-in initial voltage VDCi to be applied to the loop filter 16 is set step by step in accordance with the frequency set value f(s). Concretely, as shown in FIG. 4, a circuit for generating divided voltages Vc1, Vc2, Vc3 and Vcp-max obtained by dividing the control voltage variable range from Vcp-max to Vcp-min into M pieces (for example, four) is provided. The voltage closest to the filter voltage Vcp-s corresponding to the frequency set value f(s) is selected and applied as the pull-in initial voltage VDci to the loop filter 16.

Figure 5:
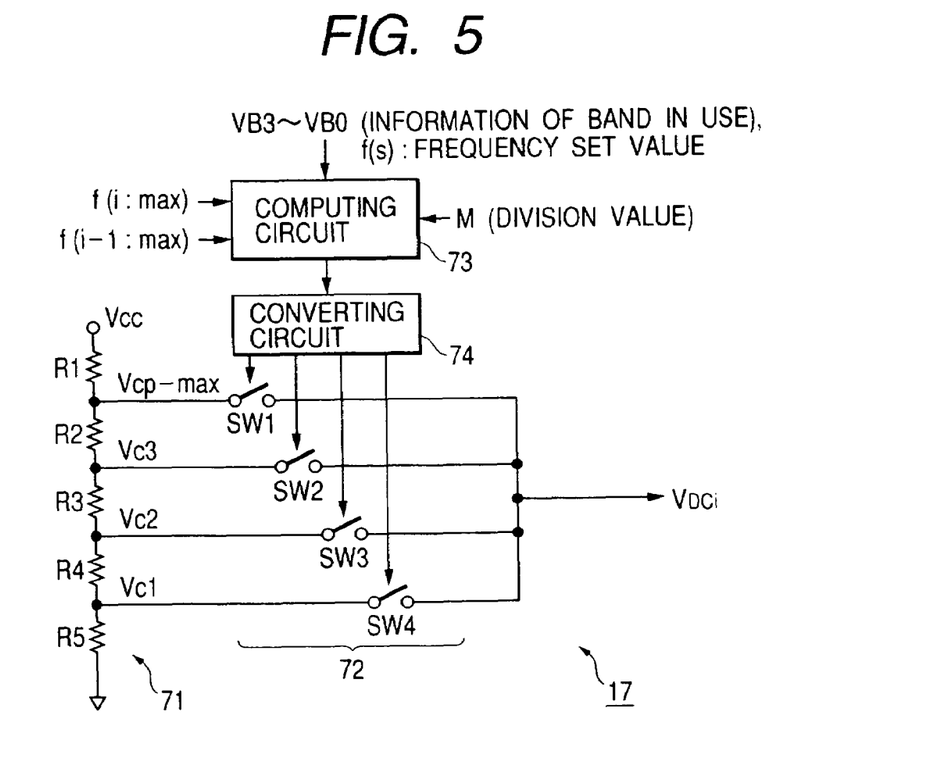
FIG. 5 is a configuration diagram showing a concrete example of a pull-in initial voltage generating circuit as a component of the PLL circuit of the embodiment.

FIG. 5 shows a concrete circuit example of the pull-in initial voltage generating circuit 17 in this case. The pull-in initial voltage generating circuit 17 in the embodiment includes: a resistive divider 71 constructed by resistors R1 to R5 connected in series between a power source voltage terminal Vcc and the ground point; a selector 72 constructed by switches SW1 to SW4 for selecting any of voltages generated by the resistive divider 71 and outputting the selected voltage; a computing circuit 73 for computing a voltage close to a filter voltage corresponding to the frequency set value f(s); and a converting circuit 74 for decoding an output of the computing circuit 73 and generating an on/off control signal for the switches SW1 to SW4 of the selector 72.

In the resistive divider 71, resistance values of the resistors R1 to R5 are set so as to be able to generate the maximum control voltage Vcp-max and divided voltages Vc1, Vc2, and Vc3. The reason why the minimum control voltage Vcp-min is unnecessary is that, even when the band i−1 next lower than the band "i" is selected and the maximum voltage Vcp-max is applied in place of selecting the band "i" and applying the voltage Vcp-min, the same result is obtained.

In the computing circuit 73, the pull-in initial voltage VDci is calculated by the following arithmetic expression.

$$VDci=Vcp\text{-min}+\{(Vcp\text{-max}-Vcp\text{-min})\cdot M\}\times INT\{(1-\Delta fB\cdot \Delta fA)\times M\}$$

where "INT" denotes formation of an integer. Although rounding-off is desirable as the formation of an integer, cut-off may be also used. By employing cut-off, the circuit can be simplified. Instead of calculating the pull-in initial voltage VDci by the arithmetic expression, it is also possible to compute an integer value by $INT\{1-\Delta fB\cdot \Delta fA\}\}\times M$ and convert the obtained value by the converting circuit 74 such as a decoder, thereby generating a control signal of the selector 72.

Figure 6:
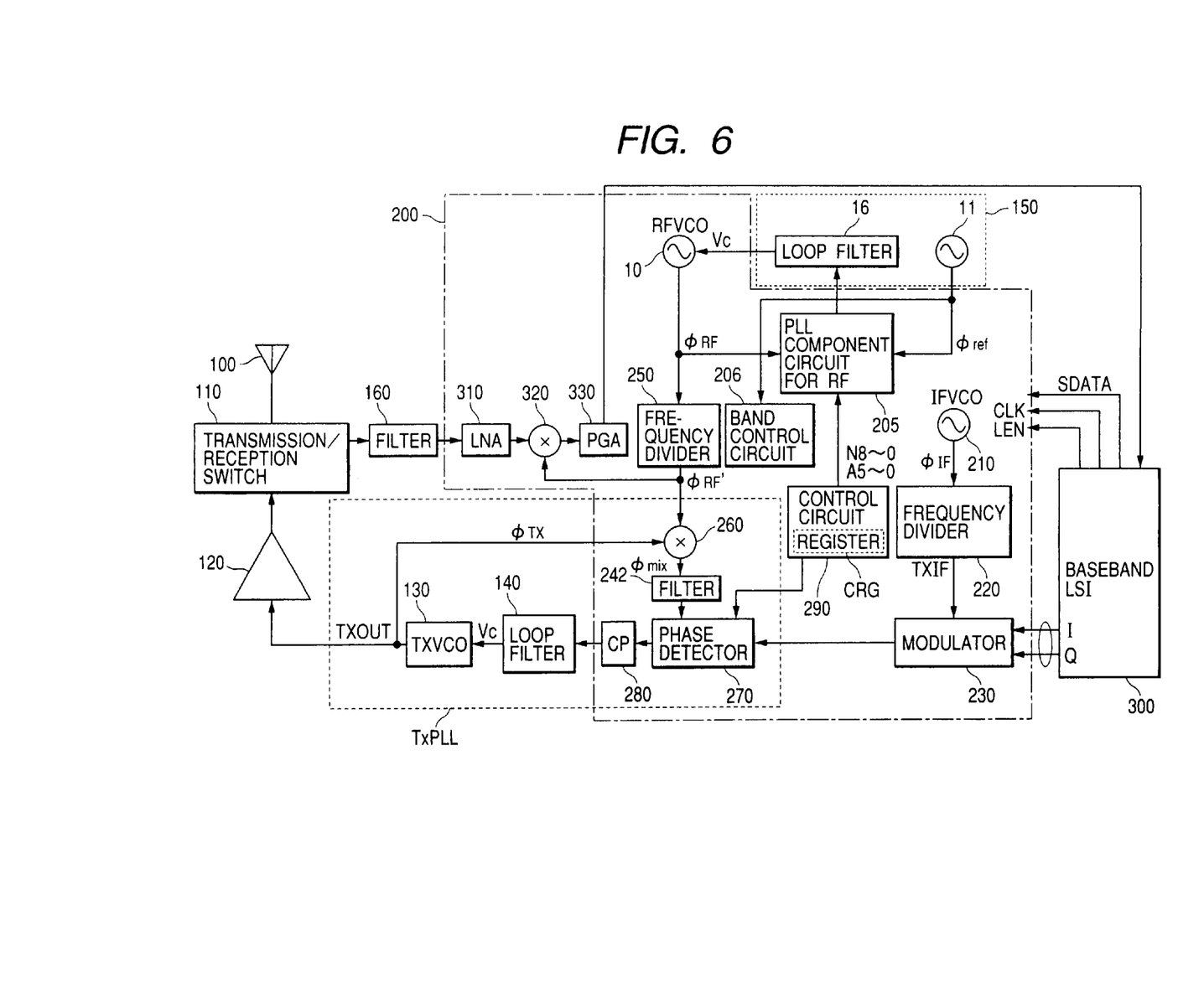
FIG. 6 is a block diagram showing an example of the configuration of a radio communication system of a direct conversion method to which the PLL circuit according to the invention is applied.

The case where the PLL circuit of the invention is applied to an RF IC as a component of a multiband radio communication system will now be described. FIG. 6 shows an example of a detailed configuration of an RF IC and a schematic general configuration of a communication system. Although not limited, the system of the embodiment is a system of a direct conversion type.

Shown in FIG. 6 are an antenna 100 for transmitting/receiving signal waves, an RF IC 200, a switch 10 for switching transmission/reception, an RF power amplifier 120 for amplifying a transmission signal, an oscillator (TXVCO) 130 for transmission, a loop filter 140 as a component of a PLL circuit on the transmission side, external circuits and parts such as the reference oscillation circuit 11 and the loop filter 16 constructing a PLL circuit for RF together with the high-frequency oscillator (RF VCO) 10 for generating an oscillation signal of a frequency according to a desired band, a high-frequency filter 160 for removing unnecessary waves from a received signal, and a baseband circuit (LSI) 300 for converting transmission data to I and Q signals and controlling the RF IC 200. The RF IC 200 is constructed as a semiconductor integrated circuit on a single semiconductor chip.

In the RF IC 200 of the embodiment, a transmission circuit is constructed by: the RF VCO 10; a PLL component circuit 205 for RF including the frequency divider 13, phase comparator 14, charge pump 15, change-over switch SW0, prescaler 21, modulo counter 22, and the like which are shown in FIG. 1, for constructing a PLL circuit together with the RF VCO 10, external reference oscillation circuit 11, and loop filter 16; a band control circuit 206 constructed by the pull-in initial voltage generating circuit 17, storing circuit 18, band determining circuit 19, and control circuit 20; an oscillation circuit (IF VCO) 210 for generating an oscillation signal φIF of intermediate frequency such as 320 MHz; a frequency divider 220 for generating a carrier wave such as 80 MHz by dividing the oscillation signal φIF generated by the oscillation circuit 210; a modulator 230 for directly modulating the carrier wave output from the frequency divider 220 by an I signal and a Q signal supplied from the baseband circuit 300; a frequency divider 250 for dividing the frequency of an oscillation signal φRF supplied from the RF VCO 10; a mixer 260 for mixing a signal φRF' obtained by the frequency dividing operation of the frequency divider 250 with a transmission signal φTX fed back from the transmission oscillator (TXVCO) 130, thereby generating a signal φmix of a frequency corresponding to a frequency difference of the two signals; a harmonic filter 242 for cutting harmonic components leaked from the mixer 260; a phase detector 270 for detecting a phase difference between a signal from the mixer 260 and a modulated signal from the modulator 230; a charge pump 280 which is operated by a signal (UP, DOWN) output from the phase detector 270; a mode control circuit 290; and the like.

On the chip of the RF IC 200, circuits constructing a reception system are provided, including: a low-noise amplifier 310 for amplifying a reception signal; a demodulating circuit 320 for performing demodulation by combining a signal obtained by dividing the frequency of the oscillation signal φRF of the RF oscillator 10 by the frequency divider 250 to the reception signal; and a programmable gain amplifier 330 for amplifying the demodulated signal and outputting the resultant signal to the baseband circuit 300. Although not limited, an RF synthesizer constructed by the external parts such as the reference oscillation circuit 11 and the loop filter 16, and the RF VCO 10, PLL component circuit 205 for RF, and band control circuit 206 which are provided on a chip is commonly used by the transmission-system circuits and the reception-system circuits.

A PLL circuit TxPLL for transmission for performing frequency conversion is constructed by the charge pump 280, phase detector 270, loop filter 140, transmission oscillator (TX VCO) 130, and mixer 260. In the multiband radio communication system, the oscillation frequency φRF of the RF oscillator 10 is switched in accordance with a used band by, for example, an instruction of the baseband circuit 300, thereby switching the transmission frequency.

The control circuit 290 is provided with a control register CRG. In the register CRG, setting is made on the basis of a signal from the baseband circuit 300. Concretely, a clock signal CLK for synchronization, a data signal SDATA, and a load enable signal LEN as a control signal are supplied from the baseband circuit 300 to the RF IC 200. When the load enable signal LEN is asserted to the effective level, the mode control circuit 290 sequentially receives the data signals SDATA transmitted from the baseband circuit 300 synchronously with the clock signals CLK and sets the data signals SDATA into the control register CRG. Although not particularly limited, the data signals SDATA are transmitted in series. The baseband circuit 300 is constructed by a microprocessor and the like.

The control register CRG has, although not particularly limited, a control bit for starting frequency measurement of the RF VCO 10 in the foregoing embodiment, a bit for designating a mode such as a reception mode, a transmission mode, a standby mode or sleep state in which only a part of circuits operates and circuits in the most part including at least the oscillation circuit stop at the time of waiting or the like, and a warm-up mode for starting the PLL circuit, and a bit for designating a pull-in mode of the PLL circuit TxPLL for transmission.

Table 1 shows an example of setting of the frequencies of the oscillation signals φIF, φTX and φRF of the oscillator (IFVCO) 210 for intermediate frequency, oscillator (TX-VCO) 130 for transmission, and oscillator (RFVCO) 10 for high frequency in the RF IC for triple bands of the embodiment.

TABLE 1

| | IFVCO (MHz) | TXIF (MHz) | TXVCO (MHz) | RXVCO (MHz) reception | RXVCO (MHz) transmission |
|---|---|---|---|---|---|
| GSM900 | 640 | 80 | 880 | 3700 | 3840 |
| | 640 | 80 | 915 | 3840 | 3980 |
| DCS1800 | 640 | 80 | 1710 | 3610 | 3580 |
| | 640 | 80 | 1785 | 3760 | 3730 |
| PCS1900 | 640 | 80 | 1850 | 3860 | 3860 |
| | 640 | 80 | 1910 | 3980 | 3980 |

As shown in Table 1, in the embodiment, the oscillation frequency of the oscillator (IF VCO) 210 for intermediate frequency is set to 640 MHz in any of the cases of GSM, DCS, and PCS, which is divided into ⅛ by the frequency divider 220, thereby generating a carrier wave TXIF of 80 MHz. In such a manner, modulation is performed.

On the other hand, the oscillation frequency of the RF oscillator (RF VCO) 10 is set to 3840 to 3980 MHz in the case of the GSM, 3580 to 3730 MHz in the case of DCS, and 3860 to 3980 MHz in the case of the PCS. By the frequency divider 250, in the case of the GSM, the oscillation frequency is divided into ¼ and, in the case of the DSC and PCS, the oscillation frequency is divided into ½. The resultant signal is supplied as φRF' to the mixer 260. From the mixer 260, a signal corresponding to the difference (FRF-FTX) between φRF' and the frequency of the transmission oscillation signal φTX from the oscillation circuit 130 for transmission is output. The transmission PLL (TxPLL) operates so that the difference signal and the frequency FTXIF of the modulation signal coincide with each other.

In the embodiment of FIG. 6, the case where the PLL circuit of the invention is applied as a PLL circuit for RF for generating an RF signal (high frequency signal) to be mixed with a reception signal in the mixer 260 is shown. Alternately, the PLL circuit of the invention may be applied as a PLL circuit for IF for generating an IF (intermediate frequency) signal to be mixed with a transmission signal by a mixer. Although not shown, the PLL circuit of the invention can be also applied as a PLL circuit for transmission for generating a transmission signal in an RF IC of a direct up-conversion method for modulating a transmission signal directly by an I signal and a Q signal from the baseband circuit 300.

An embodiment of applying the PLL circuit of the invention to an RF IC in a radio communication system of a polar loop type will now be described by referring to FIG. 7.

Figure 7:
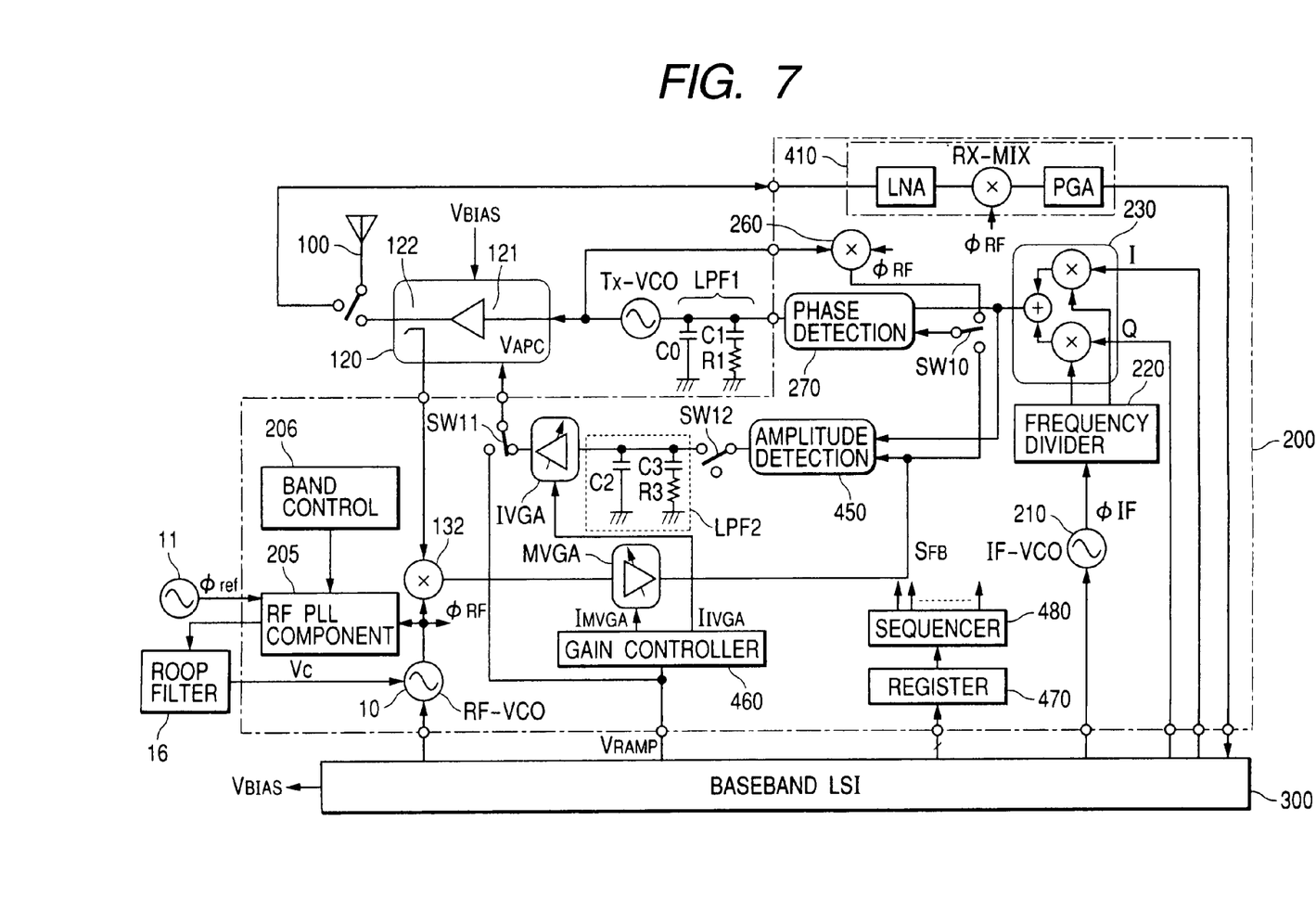
FIG. 7 is a block diagram showing an example of the configuration of a radio communication system of a polar loop method to which the PLL circuit according to the invention is applied.

Shown in FIG. 7 are the power module 120 including an RF power amplifier 121 for driving the antenna 100 and performing transmission and a coupler 122 for detecting a transmission power, an RF IC 200 capable of performing GMSK modulation in a GSM system and 8-PSK modulation in an EDGE system, a baseband circuit 300 for generating I and Q signals on the basis of transmission data (baseband signal) and generating a control signal for the RF IC 200 and a bias voltage VBIVGAS to the power amplifier 121 in the power module 120, an oscillator TxVCO for transmission for generating a phase-modulated transmission signal (carrier wave), and a loop filter LPF1 for regulating the band of a phase control loop.

Each of the RF IC 200 and the baseband LSI 300 is constructed as a semiconductor integrated circuit on a single semiconductor chip. On the chip of the RF IC 200, not only circuits of a transmission system but also a reception system circuit 410 including a low noise amplifier (LNA), a mixer (Rx-MIX) for down-converting a reception signal to a signal of an intermediate frequency, and a programmable gain amplifier (PGA) of high gain is formed.

The polar loop type radio communication system of the embodiment has two control loops of not only a feedback loop for phase control (hereinbelow, called a phase loop) but also a feedback loop for amplification control (hereinbelow, called an amplitude loop).

The RF IC 200 as a component of the polar loop of the embodiment includes: the oscillator (RF VCO) 10 for generating the oscillation signal φRF of high frequency; the oscillator (IF VCO) 210 for generating the oscillation signal φIF of intermediate frequency; the phase frequency divider 220 for generating a signal of which phase is shifted from the phase of the oscillation signal φIF generated by the IF VCO 210 by 90°; the quadrature modulator 230 for performing quadrature modulation by mixing the I and Q signals supplied from the baseband LSI 300 with a signal obtained by frequency division by the phase frequency divider 220; the mixer 260 for mixing a feedback signal from the oscillator TxVCO for transmission with the oscillation signal φRF from the RF VCO 10 to perform down-conversion to a signal of 80 MHz or the like; the phase detector 270 for detecting a phase difference between an output signal of the mixer 260 and an output signal of the quadrature modulator 120; a mixer 132 for mixing a signal from the coupler 122 for detecting an output level of the power amplifier 121 and the oscillation signal φRF from the RF VCO 10; a feedback-side variable gain amplifier MVGA for amplifying an output of the mixer 132; an amplitude detector 450 for comparing the amplified signal and an output signal of the quadrature modulator 230 to detect an amplitude difference; a loop filter LPF2 for generating a voltage according to an output of the amplitude detector 450 and regulating a frequency band of the amplitude loop; a forward-side variable gain amplifier IVGA for amplifying an output of the loop filter LPF2; a gain controller 460 for controlling the gains of the variable gain amplifiers MVGA and IVGA; a register 470 for setting control information, an operation mode, and the like in the chip; and a sequencer 480 for outputting timing signals to circuits in the chip on the basis of the set value in the register 470 and operating the circuits in a predetermined order in accordance with an operation mode.

The RF IC 200 of the embodiment has, in correspondence with the RF VCO 10: the PLL component circuit 205 for RF including the frequency divider 13, phase comparator 14, charge pump 15, change-over switch SW0, prescaler 21, and modulo counter 22 shown in FIG. 1 and constructing a PLL circuit together with the RF VCO 10, external reference oscillation circuit 11, and loop filter 16; and the band control circuit 206 including the pull-in initial voltage generating circuit 17, storing circuit 18, band determining circuit 19, and control circuit 20. With the configuration, automatic selection of the optimum band and pull-in of the PLL circuit on start of transmission/reception can be performed at high speed. The reference oscillation circuit 11 for generating a reference oscillation signal takes the form of an external part.

In the embodiment, the amplitude loop is constructed by the coupler 122, mixer 132, variable gain amplifier MVGA, amplitude detector 450, loop filter LPF2, variable gain amplifier IVGA, and power amplifier 121. The phase loop is constructed by the phase detector 270, loop filter LPF1, oscillator TxVCO for transmission, mixer 260, and phase detector 270. In the phase loop, if a phase difference occurs between the output signal of the quadrature modulator 30 and the feedback signal from the mixer 260, a voltage to decrease the error is supplied to a frequency control terminal of the oscillator TxVCO for transmission, and the phase of a feedback signal from the mixer 260 come to coincide with the phase of the output signal of the quadrature modulator 230. By the phase loop, a control to prevent the phase of the output of the oscillator TxVCO for transmission from being shifted due to fluctuations in power voltage and changes in temperature is performed. The amplitude of the oscillation TxVCO for transmission is constant.

Further, in the embodiment, a change-over switch SW10 for feeding back an output of the variable gain amplifier MVGA to the phase detector 270 to make a path of the coupler 122, mixer 132, and variable gain amplifier MVGA a feedback path commonly used by the amplitude loop and the phase loop is provided. The switch SW10 is switched by the sequencer 480 in accordance with a set state to the register 470 from the baseband LSI 300.

In the EDGE mode, both a phase modulation component and an amplitude modulation component are included in an output of the power amplifier 120. Consequently, an output of the oscillator TXVCO for transmission or an output of the power amplifier 121 may be used as a feedback signal to the phase detector 270 having a phase component on the output side. However, at start of transmission, an output of the power amplifier 121 is not high yet, so that the phase loop cannot be locked by the feedback signal from the amplitude loop. On the other hand, in the EDGE modulation mode, a feedback bus of the amplitude loop is indispensable, so that after the loop is locked, the amplitude loop may be shared and the phase loop in a narrow sense including the mixer 260 may be interrupted. It produces advantages such that power consumption can be reduced and phase modulation can be performed with higher precision. In the embodiment, at the rise of an output, the switch SW10 is switched to the side of selecting a feedback signal from the phase loop. After the loop is stabilized, the switch SW10 is switched to the side of selecting a feedback signal from the amplitude loop.

The loop filter LPF1 on the phase loop is constructed by capacitors C0 and C1 and a resistor R1 connected to the capacitor C1 in series. The values of capacitors and resistor are determined so that the frequency band of the loop filter LPF1 becomes a frequency band of 1.2 MHz or the like in which the degree of noise suppression is high in consideration of the GMSK modulation mode of performing only phase modulation.

In the transmission circuit of the embodiment, in the case of operating in an 8-PSK modulation mode, in the amplitude loop, an output of the power amplifier 120 is detected by the coupler 122, a detection signal is converted by the mixer 132 to an intermediate frequency band (IF), the resultant is amplified by the variable gain amplifier MVGA, and the amplified signal is supplied as a feedback signal SFB to the amplitude detector 450. The transmission signal modulated by the quadrature modulator 230 and the feedback signal SFB are compared with each other by the amplitude detector 450 to thereby detect an amplitude difference. The amplitude difference is amplified by the variable gain amplifier MVGA, the resultant is applied as a control voltage VAPC to the output control terminal of the power amplifier 210, and the amplitude control is performed.

In the embodiment, the power amplifier 121 is constructed by an FET or the like. To the drain terminal or source terminal of the FET, a drive voltage (Vdd) according to the control voltage VAPC is generated and applied by a voltage control circuit (not shown) provided for the power module 120. To the gate terminal of the power FET, a proper bias voltage VBIAS generated by a not-shown bias circuit is applied.

The gain control for the variable gain amplifier IVGA on the forward path and the variable gain amplifier MVGA on the feedback path will now be described.

In a portable telephone terminal conformed with EDGE or GSM, a power control for increasing or decreasing an output power POUT of the power amplifier to a desired value within predetermined time is performed. In a polar loop, the power control is executed by controlling the gain of the variable gain amplifier MVGA. Concretely, by decreasing the gain of the variable gain amplifier MVGA, the feedback signal of the amplitude loop is decreased. To make the feedback signal match with a reference signal from the modulator, the power amplifier is controlled so that the gain GPA(POUT/PIN) increases, and the output power POUT increases. To decrease the output power POUT, it is sufficient to decrease the gain of the variable gain amplifier MVGA. In the embodiment, the gain control of the variable gain amplifier MVGA is executed by a control voltage VRAMP from the baseband LSI 300. Moreover, the ratio of decrease or increase of the gain GMVGA of the variable gain amplifier MVGA and the ratio of increase or decrease of the gain GPA of the power amplifier are set to be always equal to each other.

Consequently, a change in the gain of the variable gain amplifier MVGA with respect to the control voltage VRAMP is expressed by a straight line which slants to the right. A change in the gain of the power amplifier 120 with respect to the control voltage VRAMP is expressed by a straight line which rises to the right. The output power POUT of the power amplifier 120 increases linearly with respect to the control voltage VRAMP. As described above, to control the output power POUT of the power amplifier 120 linearly in unit of dB by the control voltage VRMP is valid to stably operate the amplitude loop.

On the other hand, a reference signal from the modulator 230 is a signal modulated by the 8-PSK. Although an amplitude component changes, a control is executed so that the amplitude component of the output power POUT of the power amplifier coincides with the reference signal SREF by the action of the amplitude control loop. The output power POUT of the power amplifier 120 is maintained at a desired value by the power control. In the polar loop as described above, a desired output power can be maintained without exerting an influence on the amplitude component modulated by the 8-PSK.

Although the invention achieved by the inventors et al. has been concretely described on the basis of the embodiments, the invention is not limited to the embodiments. For example, a case where the division number M of the control voltage is "4" in the PLL circuit of the embodiment has been described. The division number is not limited to "4" but my be "5" or "6". The larger the division number is, the more the pull-in time can be shortened by accurately setting the pull-in initial voltage VDci. When the division number is too large, however, the circuit scale of the pull-in voltage generating circuit 17 becomes large and timer control of pull-in time becomes complicated. Consequently, according to a circuit format, when the division number is set to be too large, there is a case that a demerit exceeds a merit.

Although the frequency of the VCO 10 measured by using a predetermined direct current voltage (Vcp-max in the embodiment) is stored in the storing circuit 18 and the pull-in initial voltage is selected on the basis of the frequency information read from the storing circuit 18 and designated frequency information from the baseband circuit at start of the operation of the PLL circuit. Alternately, it is also possible to measure the frequency of the VCO 10 by using a plurality of direct-current voltages (Vcp-max, Vc3, Vc2, Vc1, and the like in FIG. 4), store the measured frequencies in the storing circuit 18 and, at start of the operation of the PLL circuit, and select the pull-in initial voltage on the basis of the frequency information read from the storing circuit 18 to determine the use band by the band determining circuit 19.

Further, in the embodiment, the storing circuit 18 for storing the pre-measured frequency of the VCO 10 and the band determining circuit 19 for determining the use band of the VCO 10 are provided in the RF IC. It is also possible to omit the band determining circuit 19 and provide only the storing circuit 18 in the RF IC. At start of operation of the PLL circuit, the baseband circuit 300 reads out the frequency information from the storing circuit 18 and determine a use band of the VCO 10. A signal for controlling the selector 72 in the pull-in initial voltage generating circuit 17 may be supplied together with the band switch codes VB3 to VB0. Further, in the embodiment, the direct-current voltage VDC at the time of frequency measurement is applied from the voltage generating circuit 17 to the VCO 10 via the loop filter 16. The VCO control voltage Vc may be directly applied from the voltage generating circuit 17 to the VCO 10.

The case where the invention achieved mainly by the inventors herein is applied to the PLL circuit used for the radio communication system of a portable telephone in the field of utilization as a background of the invention has been described. The invention is not limited to the case but can be also applied to a semiconductor integrated circuit having a PLL circuit, particularly, a semiconductor integrated circuit having a PLL circuit in which a variable frequency range of the VCO is wide.

Effects produced by representative inventions in the inventions disclosed in the application will be briefly described as follows.

According to the invention, an initial voltage which is extremely close to a control voltage applied when an oscillation circuit oscillates at a desired frequency on start of oscillating operation can be applied. Consequently, it is unnecessary to provide a current source for pull-in of the PLL and, moreover, the communication semiconductor integrated circuit device having a PLL circuit capable of performing pull-in accurately at high speed can be realized. Further, in a radio communication system using the communication semiconductor integrated circuit device of the invention, communications by signals in a plurality of frequency bands are possible. Moreover, the VCO can be formed on a single semiconductor chip together with a modem or the like. Thus, the number of components constructing the system can be reduced and the miniaturization of the device can be achieved.

What is claimed is:

1. A semiconductor integrated circuit device for a wireless communication system, comprising:
an oscillation means for generating an oscillation signal having an oscillation frequency in accordance with frequency instruction information, including: a phase detection circuit which detects a phase difference between a reference signal of a predetermined frequency and a feedback signal; a charge pump circuit for generating a first voltage in response to the phase difference detected by the phase detection circuit; and an oscillation circuit for oscillating on the basis of a second voltage of a filter capacitor charged/discharged by the charge pump circuit;
a storing means for storing measured frequency information of the oscillation circuit;
a frequency band determination means for comparing the measured frequency information stored with the frequency instruction information, and generating a signal for determining an oscillation frequency band of the oscillation circuit;
a voltage generation means for generating a third voltage applied to the filter capacitor or the oscillation circuit on the basis of the measured frequency information adapted to an oscillation frequency band determined by the frequency band determination means stored in the storing means and the frequency instruction information;
a switching means for subjectively supplying the first voltage according to an output of the charge pump circuit or the third voltage generated by the voltage generation means as a control voltage of the oscillation circuit; and
a control means for controlling the switching means,
wherein the third voltage generated by the voltage generation means is supplied as an initial voltage to either the filter capacitor or the oscillation circuit by the switching means to perform a sink operation at start of operation of the oscillation means, and the switching means is switched to supply the control voltage according to an output of the charge pump circuit to the oscillation circuit to set the oscillation frequency of the oscillation means.

2. The semiconductor integrated circuit device for wireless communication system according to claim 1,
wherein the control voltage is determined in accordance with a frequency difference between the maximum frequency of the selected band and the set frequency, and a frequency range of the selected band, and is supplied by the switching means.

3. The semiconductor integrated circuit device for wireless communication system according to claim 1,
wherein at the time of measuring frequency of an oscillation signal of the oscillation circuit, a predetermined voltage generated by the voltage generation means is supplied to the filter capacitor or the oscillation circuit.

4. The semiconductor integrated circuit device for wireless communication system according to claim 1, further comprising:
a frequency count means capable of measuring oscillation frequency of the oscillation circuit,
wherein the control means supplies a predetermined direct-current voltage to the oscillation circuit via the switching means when the oscillation means is in an open loop state, measures the frequency in each of predetermined frequency bands by the frequency count means, stores the measured frequency information into the storing means, and makes the oscillation circuit oscillate in a designated frequency band on the basis of a signal from the frequency band determination means at the time of operating the oscillation means in a closed loop state.

5. The semiconductor integrated circuit device for wireless communication system according to claim 4, further comprising:
a division means for dividing frequency of an oscillation signal, which is arranged between the oscillation circuit and the phase detection circuit,
wherein the division means also serving as a frequency count means used at the time of the frequency measurement.

6. The semiconductor integrated circuit device for wireless communication system according to claim 5,
wherein the division means comprising:
a frequency division circuit capable of switching a frequency division ratio;
a first programmable counter capable of computing a value corresponding to a quotient obtained by dividing a frequency of a signal to be output from the oscillator by a frequency of the reference signal and further dividing the resultant by one of frequency division ratios of the frequency divider; and
a second programmable counter capable of computing a value corresponding to a remainder of the division,
wherein a value computed by the first programmable counter is stored in the storing means.

7. The semiconductor integrated circuit device for wireless communication system according to claim 6,
wherein the frequency band determination means compares measured frequency information stored in the storing means and frequency information set in the first and second programmable counters to generate a signal for designating the oscillation frequency band of the oscillation circuit.

8. The semiconductor integrated circuit device for wireless communication system according to claim 1, further comprising:
a first mixture means for mixing the oscillation signal output from the oscillation means, or a signal obtained by divided the oscillation signal, with a reception signal, thereby obtaining a demodulated signal; and
a second mixture means for mixing the oscillation signal output from the oscillation means, or a signal obtained by divided the oscillation signal, with a transmission signal, thereby obtaining a signal having a frequency corresponding to a frequency difference between the oscillation signal output from the oscillation means, or a signal obtained by divided the oscillation signal, and a transmission signal.

9. The semiconductor integrated circuit device for wireless communication system according to claim 1, further comprising
a third mixture means for mixing an oscillation signal output from the oscillation means with a detection signal of a power amplification means, thereby obtaining a frequency-converted signal.

10. A wireless communication system comprising:
a semiconductor integrated circuit device; and
a baseband circuit,
the semiconductor integrated circuit device comprising:
an oscillation means for generating an oscillation signal having an oscillation frequency in accordance with frequency instruction information, including: a phase detection circuit which detects a phase difference between a reference signal of a predetermined frequency and a feedback signal; a charge pump circuit for generating a first voltage in response to the phase difference detected by the phase detection circuit; and an oscillation circuit for oscillating on the basis of a second voltage of a filter capacitor charged/discharged by the charge pump circuit;
a storing means for storing measured frequency information of the oscillation circuit;
a frequency band determination means for comparing the measured frequency information stored with the frequency instruction information, and generating a signal for determining an oscillation frequency band of the oscillation circuit;
a voltage generation means for generating a third voltage applied to the filter capacitor or the oscillation circuit on the basis of the measured frequency information adapted to an oscillation frequency band determined by the frequency band determination means stored in the storing means and the frequency instruction information;
a switching means for selectively supplying the first voltage according to an output of the charge pump circuit or the third voltage generated by the voltage generation means as a control voltage of the oscillation circuit; and
a control means for controlling the switching means,
wherein the third voltage generated by the voltage generation means is supplied as an initial voltage to either the filter capacitor or the oscillation circuit by the switching means to perform a sink operation at start of operation of the oscillation means, and the switching means is switched to supply the control voltage according to an output of the charge pump circuit to the oscillation circuit to set the oscillation frequency of the oscillation means,
the baseband circuit extracts data from a reception signal down-converted to a desired frequency by the communication semiconductor integrated circuit device and converts transmission data to I and Q signals, and
designated frequency information is supplied from the baseband circuit to the semiconductor integrated circuit device.

* * * * *